United States Patent
Kim et al.

(10) Patent No.: US 7,705,644 B2
(45) Date of Patent: Apr. 27, 2010

(54) BROADBAND MULTI-PHASE OUTPUT DELAY LOCKED LOOP CIRCUIT UTILIZING A DELAY MATRIX

(75) Inventors: Ho-young Kim, Seocho-gu (KR);
Dong-bee Jang, Yongin-si (KR);
Jae-yoon Sim, Pohang-si (KR);
Young-sang Kim, Pohang-si (KR)

(73) Assignees: Samsung Electronics Co., Ltd., Suwon-si, Gyeonggi-do (KR);
POSTECH Academy Industry Foundation, Pohang-si, Gyeongsankbuk-do (KR)

( * ) Notice: Subject to any disclaimer, the term of this patent is extended or adjusted under 35 U.S.C. 154(b) by 159 days.

(21) Appl. No.: 12/028,936

(22) Filed: Feb. 11, 2008

(65) Prior Publication Data

US 2008/0191765 A1   Aug. 14, 2008

(30) Foreign Application Priority Data

Feb. 12, 2007   (KR) .................... 10-2007-0014563

(51) Int. Cl.
*H03L 7/06* (2006.01)
(52) U.S. Cl. ...................... 327/158; 327/149
(58) Field of Classification Search ........... None
See application file for complete search history.

(56) References Cited

U.S. PATENT DOCUMENTS

| | | | |
|---|---|---|---|
| 6,100,735 A | | 8/2000 | Lu |
| 6,794,912 B2 * | | 9/2004 | Hirata et al. ............ 327/158 |
| 7,046,058 B1 * | | 5/2006 | Fang et al. ............. 327/158 |
| 7,187,727 B2 * | | 3/2007 | Saeki ................. 375/327 |
| 7,202,715 B1 * | | 4/2007 | Fan ................... 327/149 |
| 7,212,048 B2 * | | 5/2007 | Metz et al ............. 327/149 |
| 7,239,189 B2 * | | 7/2007 | Takayama ............. 327/161 |
| 7,276,950 B2 * | | 10/2007 | Monma et al. ........... 327/262 |
| 7,388,795 B1 * | | 6/2008 | To et al. ............... 365/194 |
| 7,400,181 B2 * | | 7/2008 | Metz et al. ............. 327/149 |
| 2006/0193419 A1 * | | 8/2006 | Maneatis et al. ......... 375/376 |

FOREIGN PATENT DOCUMENTS

| | | |
|---|---|---|
| JP | 11065699 | 3/1999 |
| JP | 2004282360 | 10/2004 |
| KR | 1020040044219 A | 5/2004 |

* cited by examiner

*Primary Examiner*—Cassandra Cox
(74) *Attorney, Agent, or Firm*—Volentine & Whitt, PLLC

(57) ABSTRACT

A broadband multi-phase output delay locked loop (DLL) circuit can be operated in a wide range of frequencies and generate various phases. Unlike conventional voltage control delay lines in which delay cells are connected in series, the DLL circuit utilizes a delay matrix in which a resistant network is used so that the number of delay cells connected in series is reduced, various phases can be outputted, and a delay interval error (phase error) due to the resistant network is minimized. The current of the delay cells is controlled so that the delay cells in the delay matrix can operate in a wide range of frequencies, and load capacitance values of capacitors connected in parallel in the delay cells can be controlled.

12 Claims, 10 Drawing Sheets

BROADBAND MULTI-PHASE OUTPUT DELAY LOCKED LOOP CIRCUIT UTILIZING A DELAY MATRIX

CROSS-REFERENCE TO RELATED PATENT APPLICATION

This application claims the benefit of Korean Patent Application No. 10-2007-0014563, filed on Feb. 12, 2007, in the Korean Intellectual Property Office, the disclosure of which is incorporated herein in its entirety by reference.

BACKGROUND OF THE INVENTION

1. Field of the Invention

Embodiments of the invention relate to a delay circuit used in storage media. More particularly, embodiments of the invention relate to a broadband multi-phase output delay locked loop circuit including a delay matrix.

2. Discussion of Related Art

Due to the growth of the semiconductor industry and material engineering, optical storage media have been developed to store high-capacity data. Currently, CD and DVD technology comprise the standardized form of optical storage media and can store 650 MB and 4.7 GB of data respectively. Next generation storage media such as, for example, a Blu-ray disc, uses a laser having a wavelength of 405 nm to store data with a capacity of approximately 25 GB in similarly sized CDs. The Blu-ray disc has the largest capacity among currently existing optical storage media and can read and write data with a minimum speed of 66 Mb/s. Accordingly, circuits which perform high speed read/write operations to such discs are also required. Different data input/output speeds depend on the position radius of the disc when data is read from the disc. In addition, consistent read/write operation must be supported in all frequency domains making the use of a broadband delay locked loop (DLL) circuit essential. In a typical 12×-speed blue-ray disc, the disc band remarkably broadens and the frequency domain required by the DLL circuit is 60 MHz to 800 MHz. Existing DLL circuit designs do not accommodate this frequency domain. In addition, the clock signals utilized by the DLL circuit must accommodate 40 different phases to generate signals for the write operation across all frequencies.

A restriction on generating the various phases at high-speeds is the relatively small delay margin. When generating N phases which are separated by the same delay, a delay margin should be T/N for a clock cycle T and an error between the delays should be smaller than T/2N. For example, if 20 phases are generated in a 12×-speed blue-ray disc, the highest frequency is set at 792 MHz and an error between the delays should be smaller than 31 ps. However, generating a plurality of phases restricts high-speed circuit operation. In other words, when N phases are generated, the number of delay stages should be N or N/2 at a minimum. Accordingly, the maximum locking frequency depends on the number of delay stages.

SUMMARY OF THE INVENTION

Exemplary embodiments of the present invention are directed to a broadband multi-phase output delay locked loop (DLL) circuit which can be operated in a wide range of frequencies and generate various phases. In an exemplary embodiment, the delay locked loop (DLL) circuit includes a delay matrix, an interpolator, a phase detector, an electric charge pump and a bias control circuit. The delay matrix is formed of M delay chains including N delay cells connected in series. The interpolator is connected to the delay matrix configured to receive a clock signal and to generate M output signals at equal interval phase differences corresponding to Td/M where Td is the delay time associated with the delay cells. The interpolator supplies the output signals to the delay cells. The phase detector is configured to receive an output signal from a first delay cell and a last delay cell of the N delay cells in a first delay chain among said M delay chains. The phase detector detects the phase difference between the output signal from the first delay cell and the output signal from the second delay cell. The electric charge pump is connected to the phase detector and is configured to generate a control voltage in response to the output signals of the phase detector. A bias control circuit is disposed between the electric charge pump and the delay matrix. The bias control circuit receives the control voltage and generates bias voltages to control the delay cells of the delay matrix.

DESCRIPTION OF EMBODIMENTS

Figure 1:
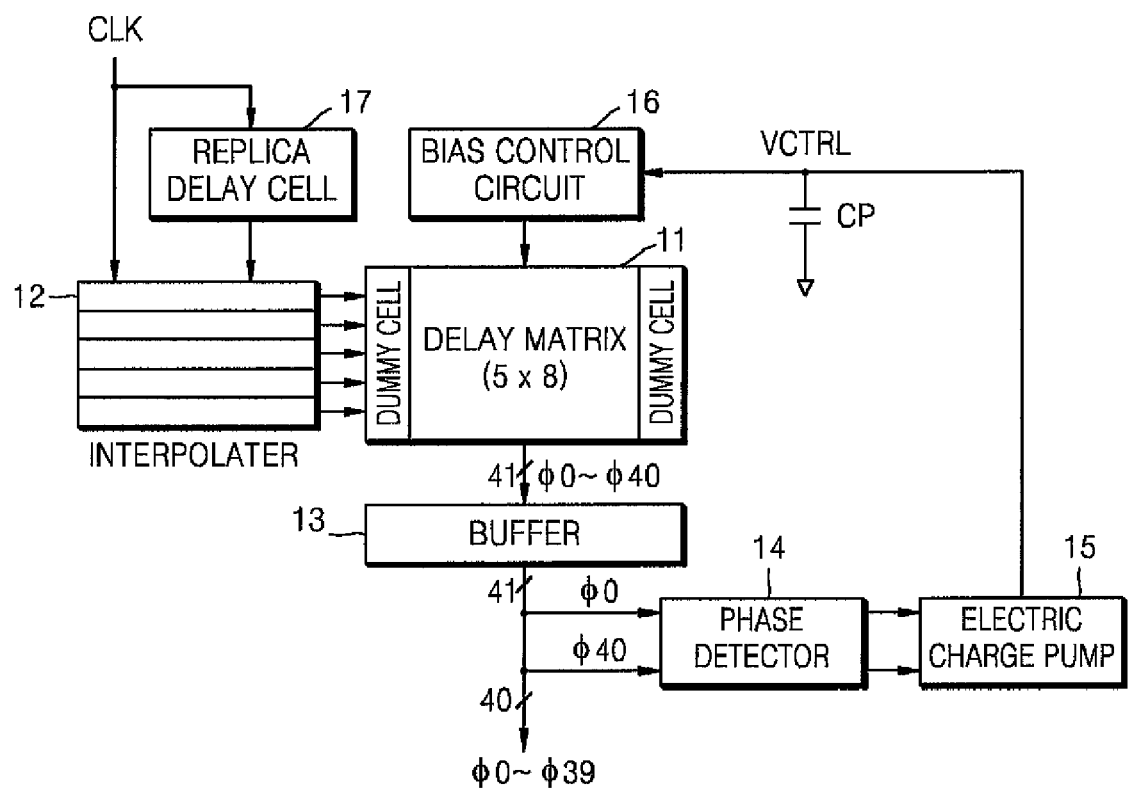
FIG. 1 is a block diagram of a broadband multi-phase output delay locked loop (DLL) circuit according to an embodiment of the present invention.

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 2:
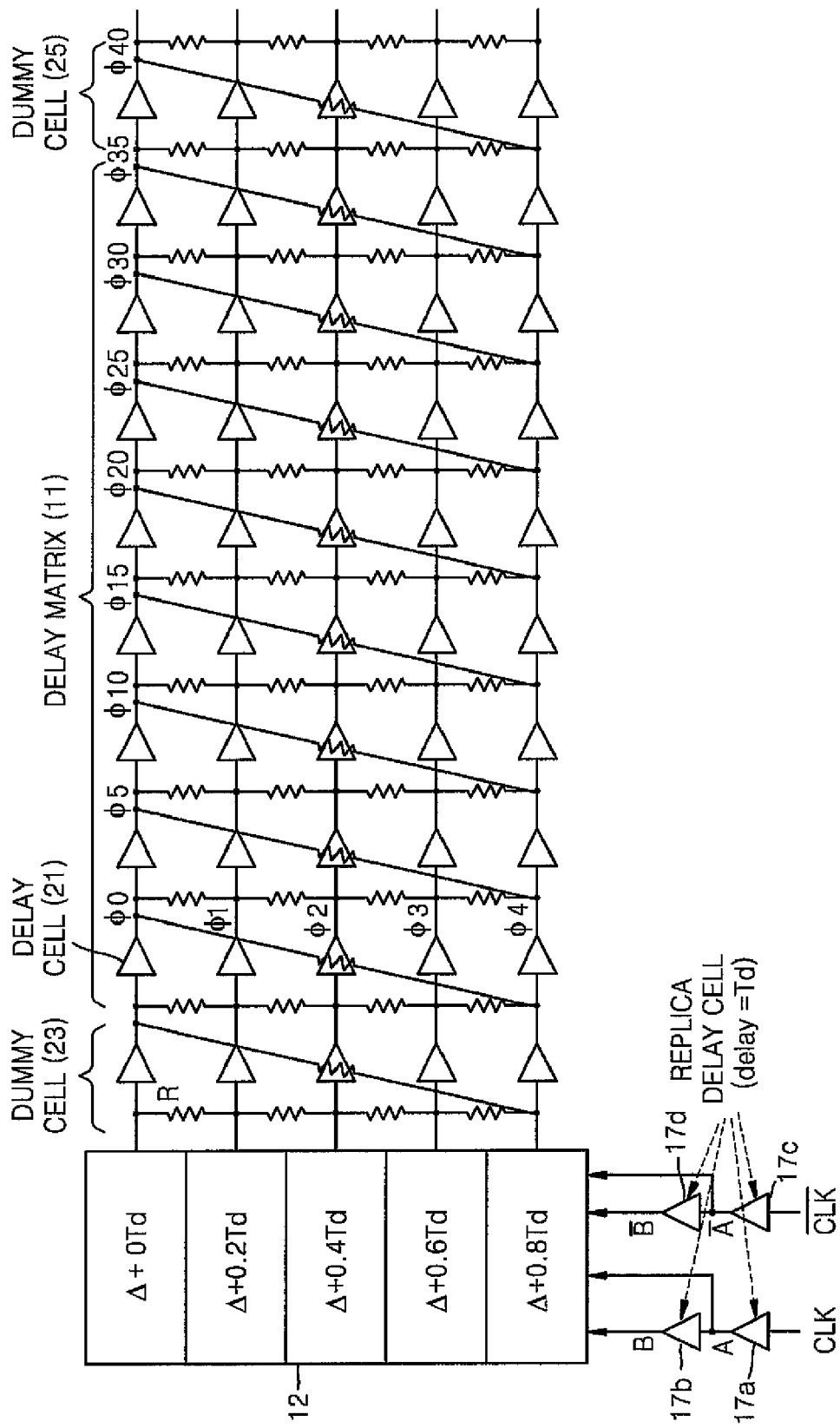
FIG. 2 is a diagram illustrating a delay matrix, an interpolator, and a replica delay cell illustrated in FIG. 1 in more detail.

FIG. 1 is a block diagram of a broadband multi-phase output delay locked loop (DLL) circuit including delay matrix 11, interpolator 12, buffer 13, phase detector 14, electric charge pump 15, bias control circuit 16, and replica delay cell 17. Clock signal CLK is supplied to interpolator 12 and replica delay cell 17. FIG. 2 illustrates delay matrix 11, interpolator 12, and replica delay cell 17 in more detail. Delay matrix 11 is formed of M delay chains defined by N delay cells 21 connected in series. FIGS. 1 and 2 illustrate delay matrix 11 with 5 delay chains (M=5) and 8 delay cells (N=8) which generate 41 output signals φ0 to φ40. The delay chains are connected through a resistance network formed of a plurality of resistors R having resistances, for example, of approximately 1 k ohm.

The delay chains include dummy cell 23 disposed at a front end of the first delay cell and dummy cell 25 disposed at a rear end of the last delay cell. Dummy delay cell 23 is added to average a phase error which may be generated due to incomplete output of interpolator 12. Dummy delay cell 25 is added to conform to output loading. Interpolator 12 receives clock signal CLK to generate M output signals having a phase difference with equal intervals corresponding to Td/M where Td is the delay time of delay cells 21. Interpolator 12 then applies the output signals to delay matrix 11. When M is 5, as illustrated in FIG. 2, interpolator 12 generates 5 output signals +0Td through +0.8Td having equal interval phase differences which correspond to 0.2Td and applies the output signals to 5 delay chains of delay matrix 11.

The buffer 13 buffers signals φ0 to φ40 outputted by delay matrix 11 and outputs signals φ0 and φ40 of the first delay cell to phase detector 14. Phase detector 14 is configured to detect a phase difference between output signals φ0 and φ40. Output signal φ40 is delayed by one cycle as compared to output signal φ0. Electric charge pump 15 responds to the output of phase detector 14 and generates control voltage VCTRL. Bias control circuit 16 receives control voltage VCTRL and generates bias voltages to operate delay cells 21 in a wide range of frequencies. Replica delay cell 17 includes first through fourth replica delay cells 17a through 17d as shown in FIG. 2 which are formed by copying delay cells 21 of delay matrix 11. The first replica delay cell 17a receives clock signal CLK and outputs signal A to second replica delay cell 17b which outputs signal B to interpolator 12. Third replica delay cell 17c receives inverse signal /CLK and outputs inverse signal /A to fourth replica delay cell 17d which outputs inverse signal /B to interpolator 12. Output signals A, B, /A, and /B of replica delay cells 17a through 17d are used as control signals to control interpolator 12. Delay matrix 11 reduces the number of delay cells 21 connected horizontally while being configured to change operation delay times to accommodate a wide range of frequencies.

Figure 3:
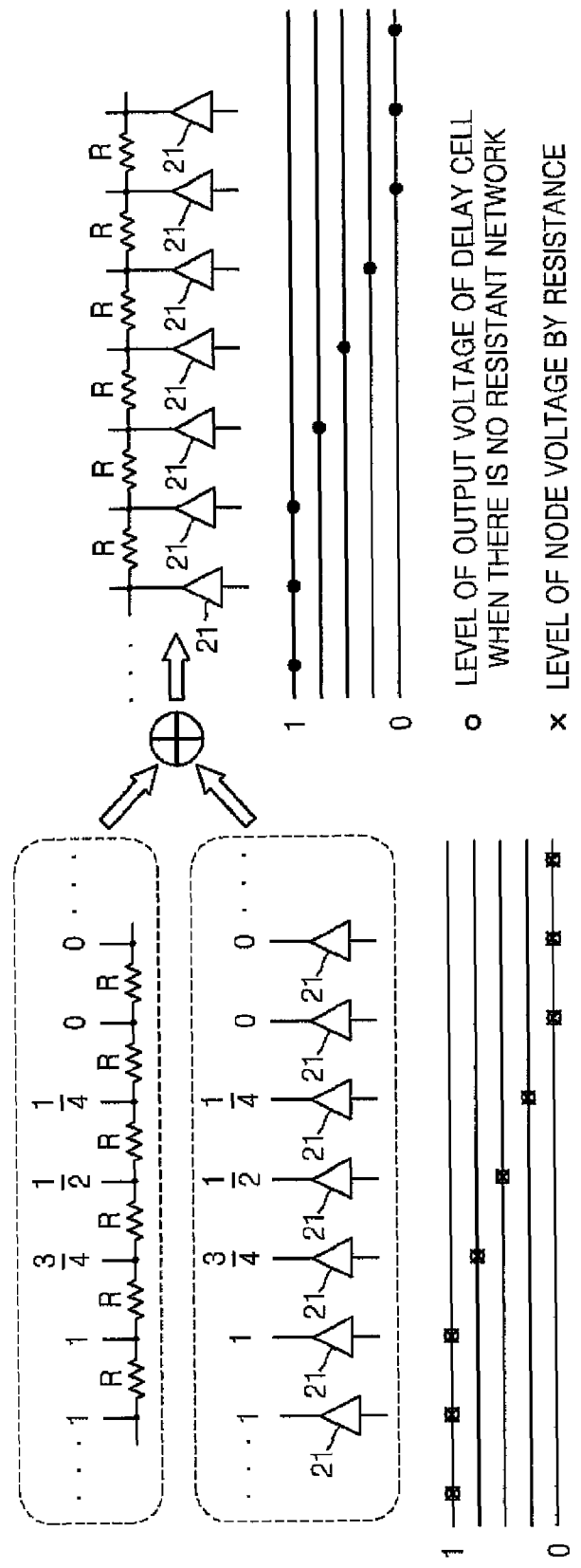
FIGS. 3 and 4 illustrate how a phase error generated due to delay cells is averaged in a resistant network used in a delay matrix.
Figure 4:
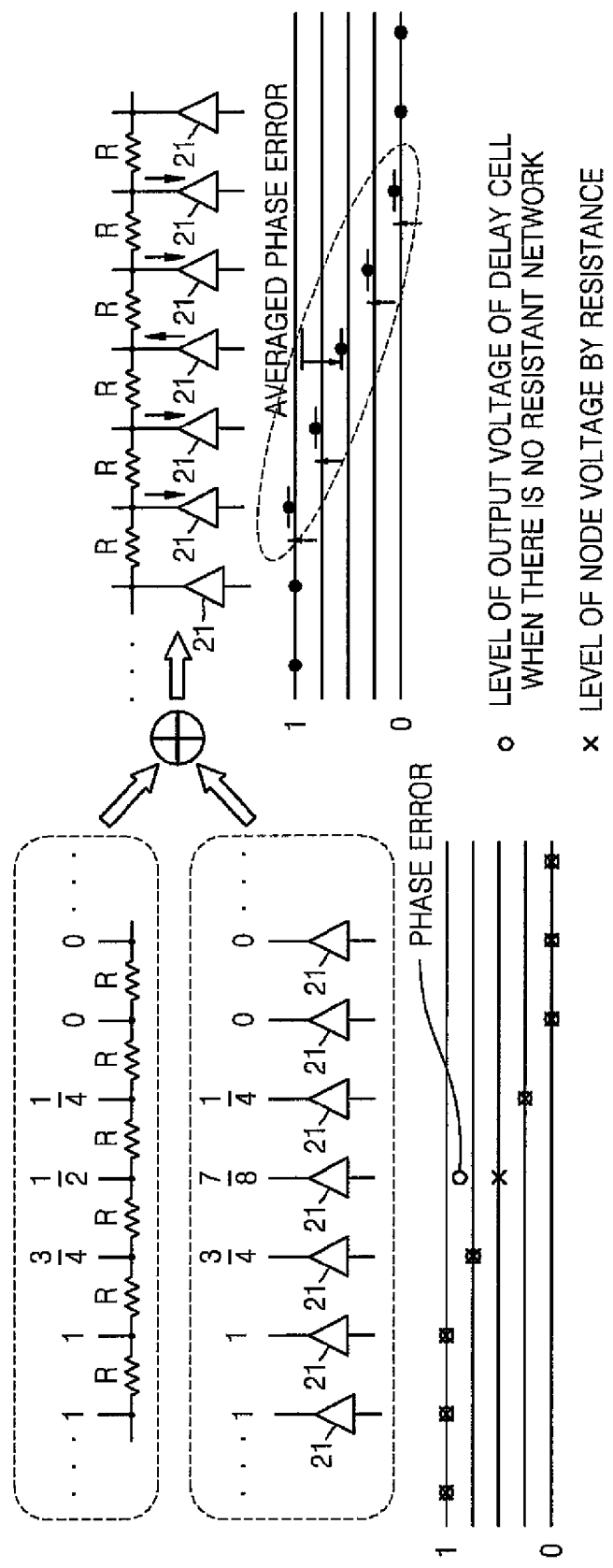

FIGS. 3 and 4 illustrate how a phase error generated due to the delay cells is averaged in the resistant network used in delay matrix 11. When no phase error exists, as illustrated in FIG. 3, a uniformly distributed voltage level is formed at the moment when a signal is changed. That is, the output voltage of delay cells 21 may have the same level as the generated node voltage level due to resistance R. With no phase error, additional current does not flow through resistance R and the resistant network does not affect delay matrix 11. When a phase error is generated due to a mis-match, as illustrated in FIG. 4, the output voltage level of delay cells 21 may have a different level as compared to the node voltage level generated due to resistance R. In this case, an additional current (shown by the arrows) flows through resistance R and the phase error is averaged.

Figure 5:
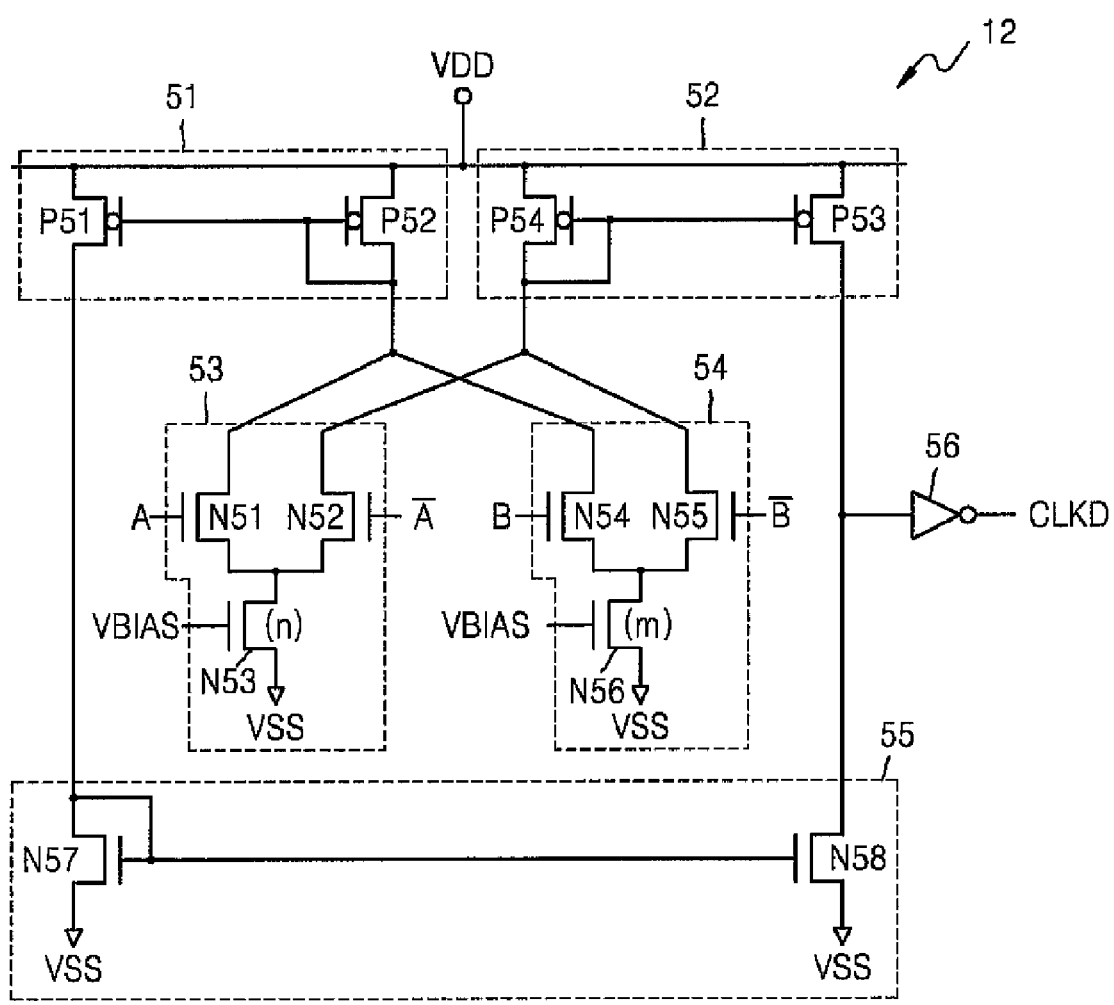
FIG. 5 is a detailed circuit diagram of a unit cell of an interpolator illustrated in FIG. 2.

FIG. 5 is a detailed circuit diagram of a unit cell of the interpolator 12 illustrated in FIG. 2. A unit cell of interpolator 12 includes first current mirror 51, second current mirror 52, first differential input unit 53, second differential input unit 54, third current mirror 55, and buffer 56. First current mirror 51 includes PMOS transistors P51 and P52 and second current mirror 52 includes PMOS transistors P53 and P54. First differential input unit 53 is connected to first current mirror 51 via PMOS transistor P52 and to second current mirror 52 via PMOS transistor P54. First differential input unit 53 includes NMOS transistors N51, N52, and N53 and is controlled by bias voltage VBIAS. First differential input unit 53 receives output signal A of first replica delay cell 17a and output signal /A of third replica delay cell 17c.

Second differential input unit 54 includes NMOS transistors N54, N55, and N56 and is connected to first current mirror 51 via PMOS transistor P52 and to second current mirror 52 via PMOS transistor P54. Second differential input unit 54 is controlled by bias voltage VBIAS and receives output signal B of the second replica delay cell 17b and output signal /B of fourth replica delay cell 17d. Third current mirror 55 includes NMOS transistors N57 and N58 and is connected to first current mirror 51 via PMOS transistor P51 and to second current mirror 52 via PMOS transistor P53. Buffer 56 includes an input connected to the contact point of second current mirror 52 and third current mirror 55 and supplies output signal CLKD.

Figure 6:
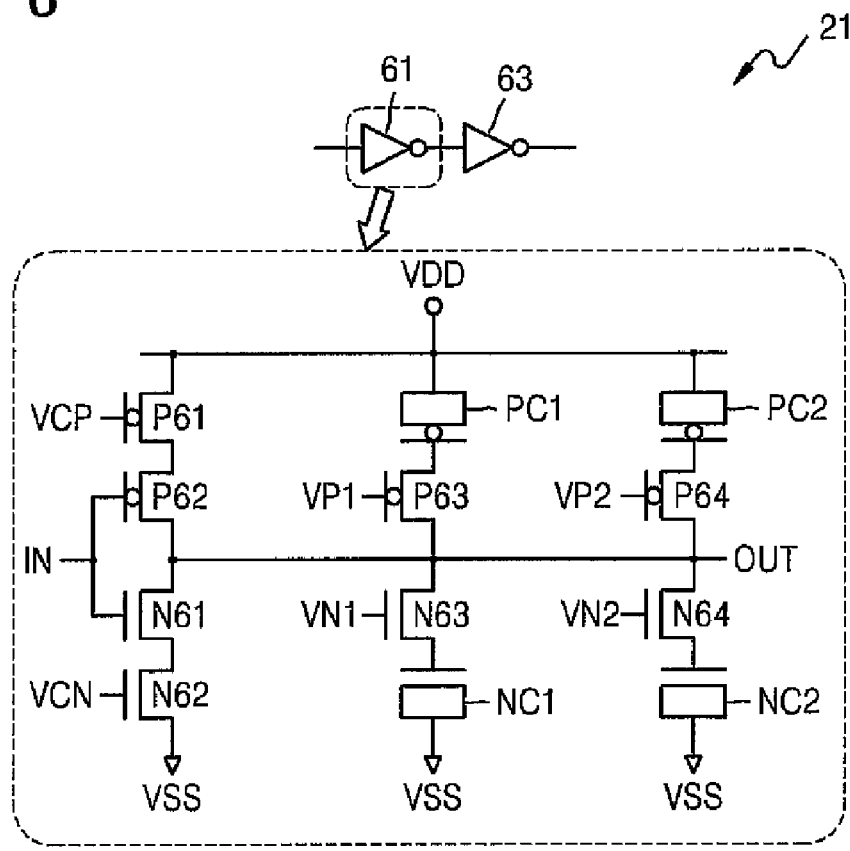
FIG. 6 is a detailed circuit diagram of a delay cell illustrated in FIG. 2.
Figure 7:
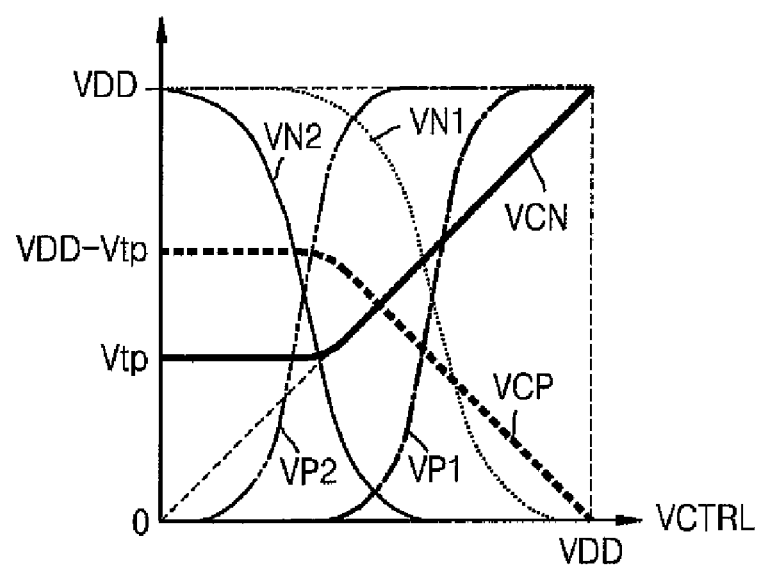
FIG. 7 is a waveform diagram of bias voltages applied to a delay cell.

FIG. 6 is a detailed circuit diagram of delay cells 21 illustrated in FIG. 2, and FIG. 7 is a waveform diagram of bias voltages VCP, VCN, VP1, VP2, VN1, and VN2 applied to delay cells 21. Referring first to FIG. 6, delay cells 21 include first current-starved inverter 61 connected in series to second current-starved inverter 63. First current-starved inverter 61 receives first through sixth bias voltages VCP, VCN, VP1, VP2, VN1, and VN2 and inverts input signal IN and outputs an inverse signal. Second current-starved inverter 63 responds to the first through sixth bias voltages VCP, VCN, VP1, VP2, VN1, and VN2 and inverts the output signal of the first current-starved inverter 61 to output an inverse signal.

First and second current-starved inverters 61 and 63 each include first PMOS switching transistor P61 connected in series to PMOS input transistor P62 between voltage source VDD and output OUT, and an NMOS input transistor N61 is connected in series to first NMOS switching transistor N62 between output OUT and ground voltage source VSS. First current-starved inverter 61 also includes first PMOS capacitor PC1 connected in series to second PMOS switching transistor P63 disposed between voltage source VDD and output OUT, and a second PMOS capacitor PC2 connected in series to third PMOS switching transistor P64. Second current-starved inverter 63 includes second NMOS switching transistor N63 connected in series to first NMOS capacitor NC1 disposed between output OUT and ground voltage source VSS. A third NMOS switching transistor N64 is connected in series to second NMOS capacitor NC2 disposed between output OUT and ground voltage source VSS.

Input signal IN is applied to gates of PMOS input transistor P62 and NMOS input transistor N61. First bias voltage VCP is applied to the gate of first PMOS switching transistor P61 and a second bias voltage VCN is applied to a gate of first NMOS switching transistor N62. Third and fourth bias voltages VP1 and VP2 are applied to the gates of the second PMOS transistor P63 and third PMOS switching transistor P64. Fifth and sixth bias voltages VN1 and VN2 are applied to second switching transistor N63 and third NMOS switching transistor N64. In particular, first and second current-starved inverters 61 and 63 can be controlled by two methods to broaden the delay change. A first method changes the first and second bias voltages VCP and VCN to control current. The second method changes the third through sixth bias voltages VP1, VP2, VN1, and VN2 to control capacitance of capacitors PC1, PC2, NC1, and NC2 connected in parallel.

As illustrated in the waveform of FIG. 7, the minimum voltage of second bias voltage VCN to control the current is fixed at a threshold voltage Vtp and the second bias voltage VCN increases in proportion to an increase in control voltage VCTRL. The minimum voltage is fixed at threshold voltage Vtp to prevent delay cells 21 from being completely blocked even when control voltage VCTRL has a very low voltage (while the DLL circuit illustrated in FIG. 1 operates at a very low operating frequency). The maximum voltage of the first bias voltage VCP to control the current is fixed at a threshold voltage VDD-Vtp and first bias voltage VCP decreases in proportion to an increase in control voltage VCTRL. In addition, the third and fourth bias voltages VP1 and VP2 swing from ground voltage level VSS to voltage level VDD according to an increase in control voltage VCTRL. In contrast, the fifth and sixth bias voltages VN1 and VN2 swing from voltage level VDD to ground voltage level VSS according to an increase in the control voltage VCTRL. In this manner, third through sixth bias voltages VP1, VP2, VN1, and VN2 swing to turn switching transistors P63, P64, N63, and N64 off when the control voltage VCTRL is high such that delay cells 21 have the minimum delay to operate at a high frequency.

In order to continuously change the delay of delay cells 21, the levels of third through sixth bias voltages VP1, VP2, VN1, and VN2 are controlled to increase the load capacitance of output node OUT of first and second current-starved inverters 61 and 63 when control voltage VCTRL is decreased. In contrast, when control voltage VCTRL is increased, the levels of the third through sixth bias voltages VP1, VP2, VN1, and VN2 are controlled to decrease the load capacitance of the output node OUT of the first and second current-starved inverters 61 and 63.

Figure 8:
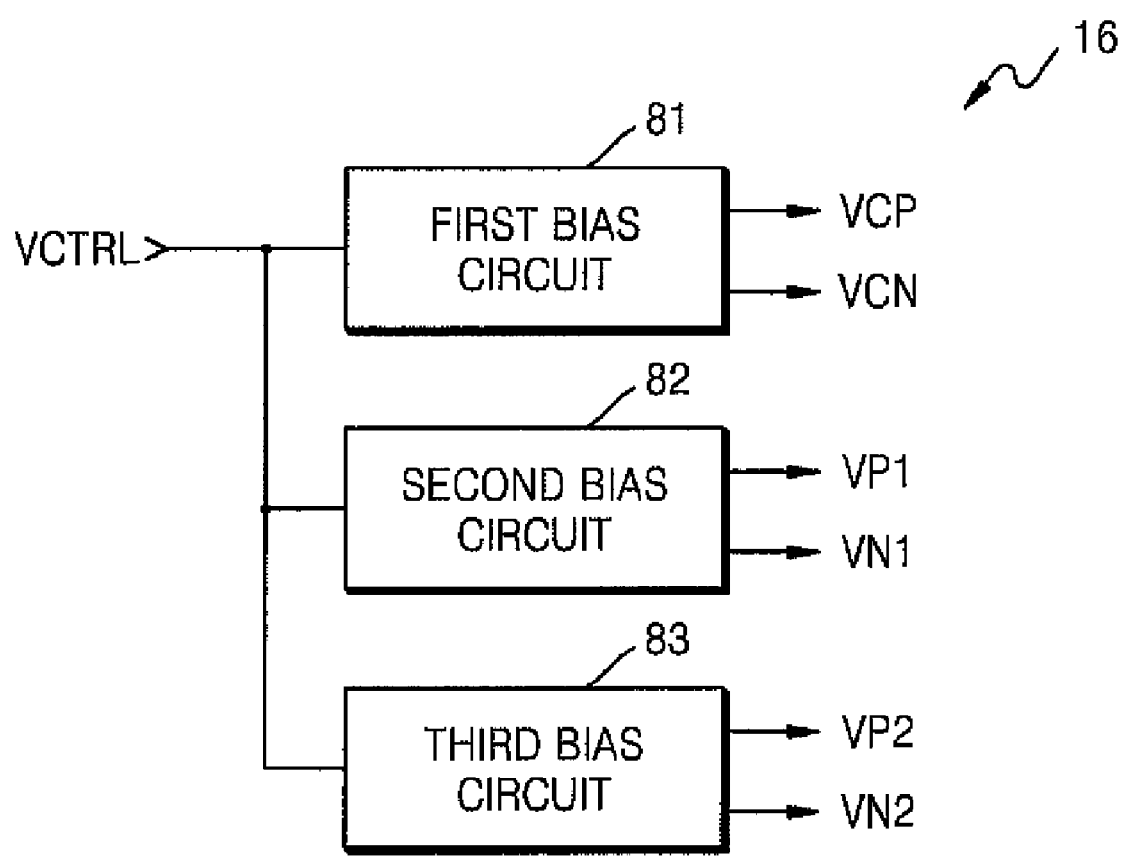
FIG. 8 is a block diagram of a bias control circuit illustrated in FIG. 1.

FIG. 8 is a block diagram of bias control circuit 16 illustrated in FIG. 1. The bias control circuit 16 generates bias voltages VCP, VCN, VP1, VP2, VN1, and VN2 which are applied to delay cells 21. Bias control circuit 16 includes first bias circuit 81, second bias circuit 82, and third bias circuit 83. First bias circuit 81 receives control voltage VCTRL outputted from electric charge pump 15 (shown in FIG. 1) to generate first and second bias voltages VCP and VCN. Second bias circuit 82 receives control voltage VCTRL to generate third and fifth bias voltages VP1 and VN1. Third bias circuit 83 receives control voltage VCTRL to generate the fourth and sixth bias voltages VP2 and VN2.

Figure 9:
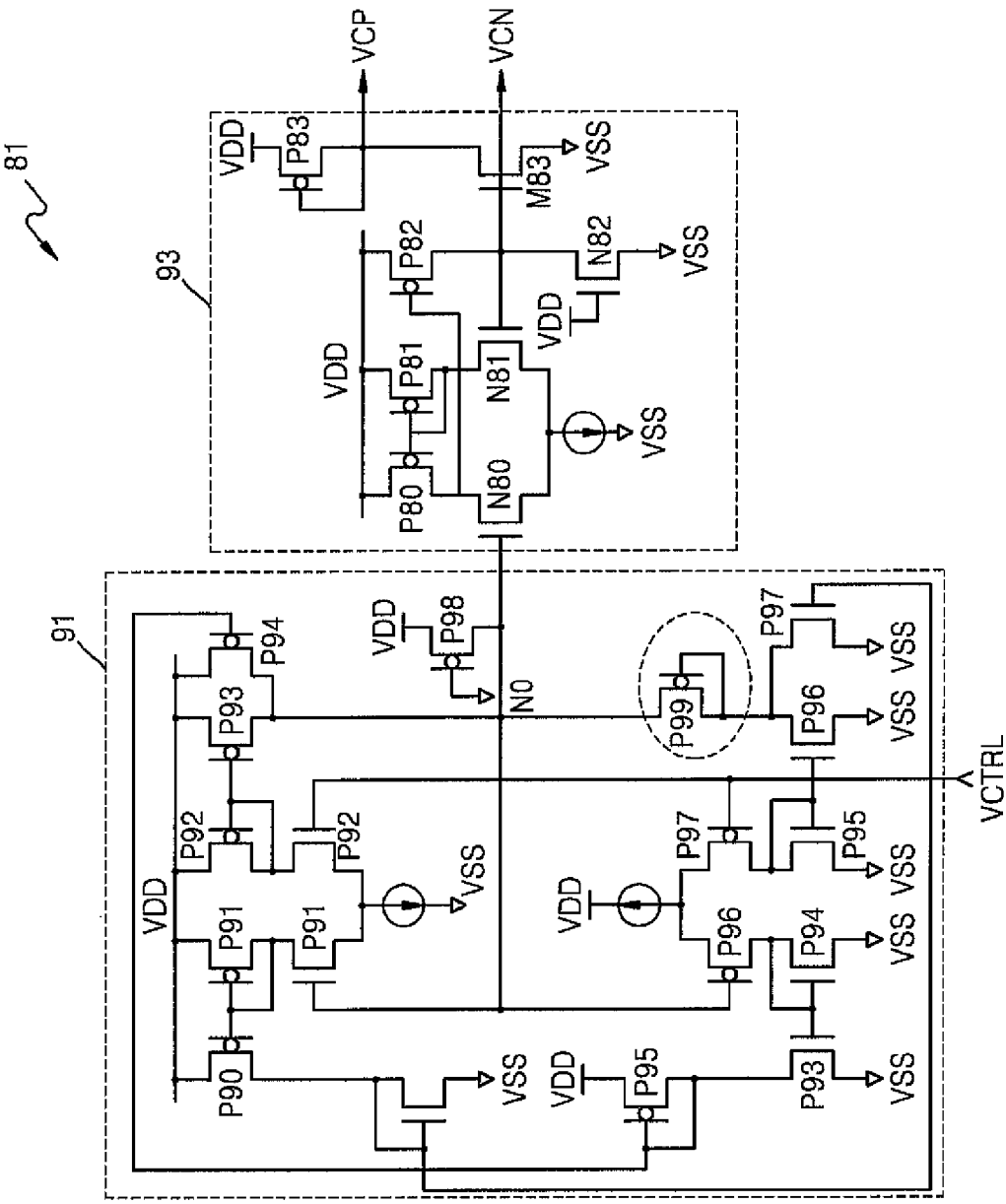
FIG. 9 is a detailed circuit diagram illustrating a first bias circuit illustrated in FIG. 8.

FIG. 9 is a circuit diagram illustrating first bias circuit 81 illustrated in FIG. 8. First bias circuit 81 includes amplifier 91 and buffer circuit 93. Buffer circuit 93 buffers an output of amplifier 91 to generate first and second bias voltages VCP and VCN. Amplifier 91 is a general rail-to-rail operational amplifier having unity-gain and includes PMOS transistors P90 to P99 and NMOS transistors N90 to N97. In particular, amplifier 91 includes diode-formed PMOS transistor P99 connected between output node NO and pull-down transistors N96 and N97. Diode-formed PMOS transistor P99 in amplifier 91 fixes the minimum voltage of second bias voltage VCN at a threshold voltage level Vtp and the maximum voltage of the first bias voltage VCP at a threshold voltage level VDD-Vtp (as shown in the waveform illustrated in FIG. 7). Buffer circuit 93 is a general buffer circuit and includes PMOS transistors P80-P83 and NMOS transistors N80-N83.

Figure 10:
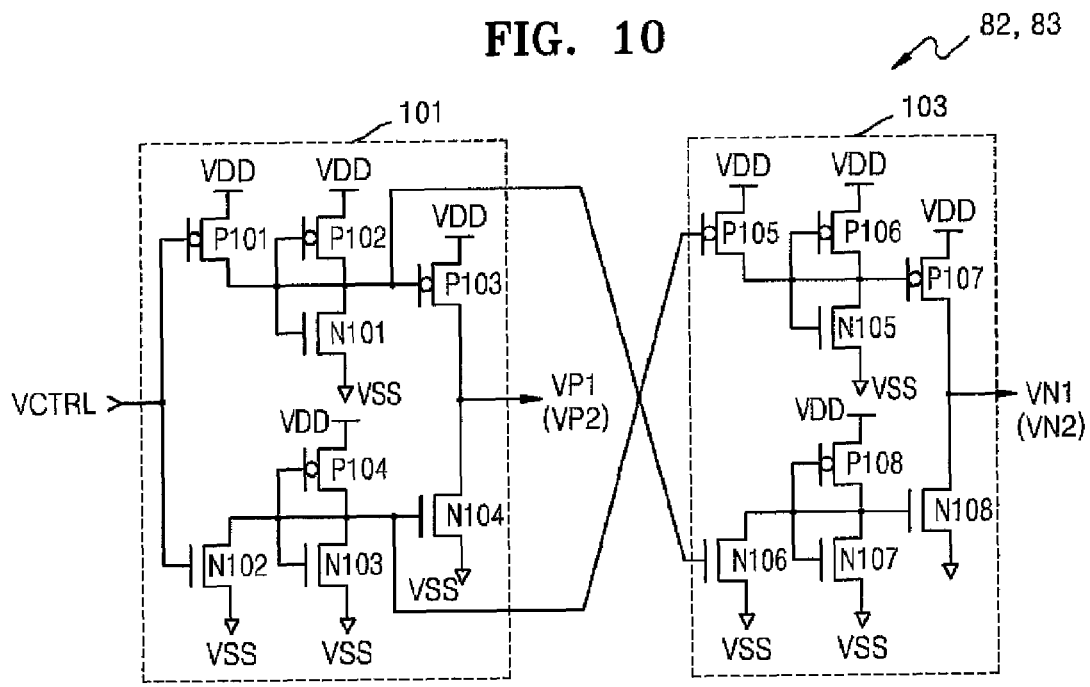
FIG. 10 is a detailed circuit diagram illustrating second and third bias circuits of FIG. 8.

FIG. 10 is a detailed circuit diagram illustrating second and third bias circuits 82 and 83 illustrated in FIG. 8. Second and third bias circuits 82 and 83 include two full swing inverters 101 and 103 respectively. First full swing inverter 101 receives control voltage VCTRL and generates third bias voltage VP1 (or the fourth bias voltage VP2) wherein third bias voltage VP1 swings from ground voltage level VSS to voltage level VDD according to an increase in control voltage VCTRL, as illustrated in the waveform of FIG. 7. First full swing inverter 101 includes PMOS transistors P101 to P104 and NMOS transistors N101 to N104. Second full swing inverter 103 is connected to first full swing inverter 101 and generates fifth bias voltage VN1 (or the sixth bias voltage VN2) where fifth bias voltage VN1 swings from voltage level VDD to ground voltage level VSS according to an increase in the control voltage VCTRL, as illustrated in the waveform of FIG. 7. Second full swing inverter 103 includes PMOS transistors P105 to P108 and NMOS transistors N105 to N108.

Figure 11:
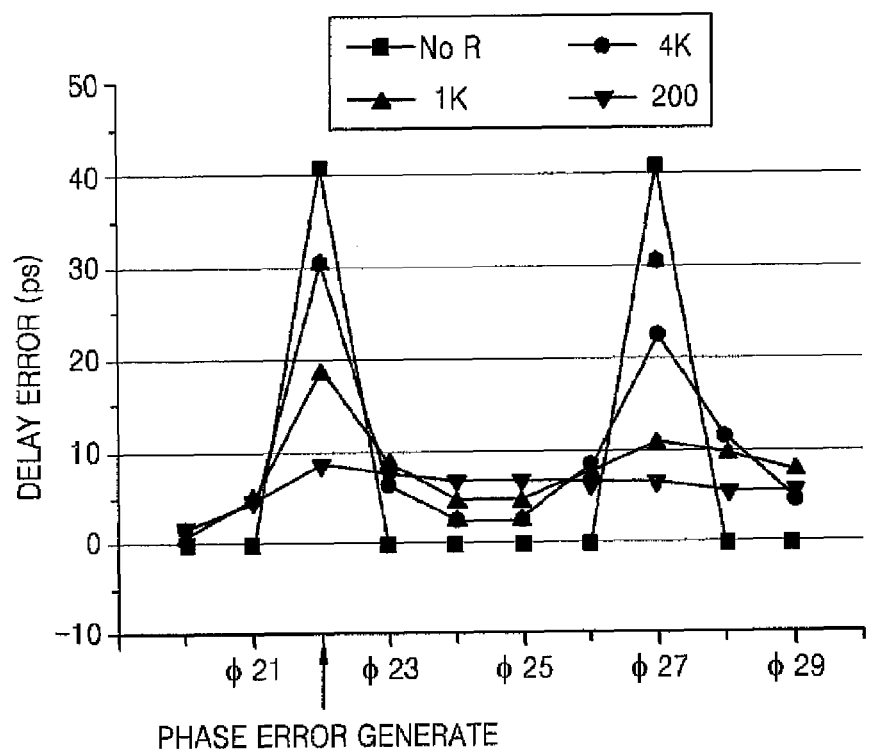
FIG. 11 illustrates that a phase error is averaged by a resistance in a delay matrix of FIG. 2.

FIG. 11 is a graphical representation of a phase error averaged by resistance R in cases where resistance R does not exist, 4K ohm, 1K ohm, and 200K. When a phase error is generated due to a mis-match between transistors, which may occur during chip manufacturing of a chip, at the $22^{nd}$ phase φ22 from among the 40 phases the delay error is shown for no R, 1K, 4K and 200K. In particular, when there is no resistance No R used in delay matrix 11, that is, when a resistance value is infinite, a phase error generated in 22nd phase φ22 directly diffuses to a 27th phase φ27 and an error may be generated in the various phases by one phase error. In contrast, when resistance R is connected to delay matrix 11, the generated phase error is averaged with the adjacent phase so that a phase error is reduced.

Figure 12:
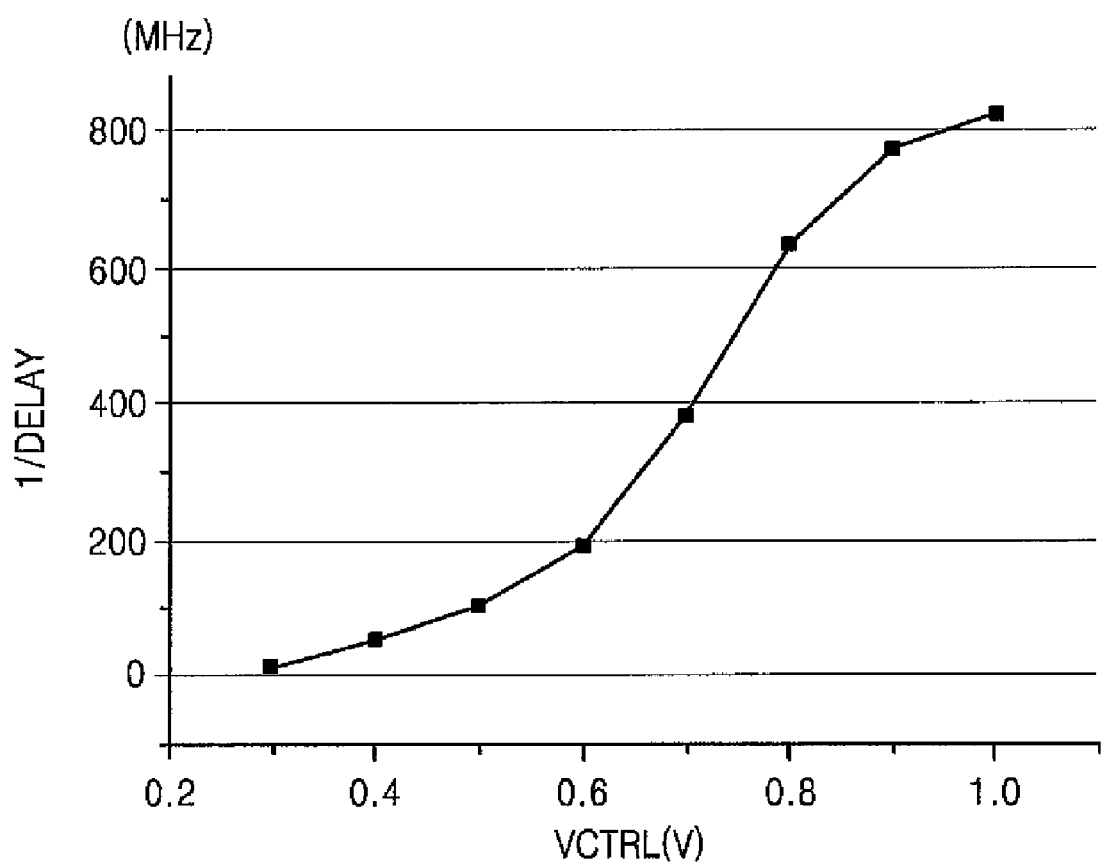
FIG. 12 is a graph showing a change of delay according to a control voltage VCTRL change in a delay cell illustrated in FIG. 6.

FIG. 12 is a graph showing a change of the delay according to control voltage VCTRL. When control voltage VCTRL is decreased, the delay of delay cells 21 increases and the operational frequency decreases. When control voltage VCTRL is increased, the delay of delay cells 21 decreases and an operational frequency increases. When control voltage VCTRL changes from 0.3 volts to 1.0 volt, delay cells 21 operate in a frequency range of 40 MHz to 800 MHz.

Unlike a conventional voltage control delay line in which delay cells are connected in series, a DLL circuit utilizing a delay matrix in which a resistant network is inserted reduces the number of delay cells connected in series, outputs various phases, and minimizes a delay interval error (phase error) due to the resistant network. In addition, the current in the delay cells can be controlled so that the delay cells in the delay matrix operate in a wide range of frequencies, and the load capacitance values of capacitors connected in parallel in the delay cells can also be controlled. In this manner, the DLL circuit can operate in a frequency range of approximately 40 MHz to 800 MHz and can generate various phases to support high-speed optical storage systems such as a 12x-speed blue-ray disc.

Although the present invention has been described in connection with the embodiment of the present invention illustrated in the accompanying drawings, it is not limited thereto. It will be apparent to those skilled in the art that various substitutions, modifications and changes may be made thereto without departing from the scope and spirit of the invention.

What is claimed is:

1. A delay locked loop (DLL) circuit comprising:
    a delay matrix formed of M delay chains including N delay cells connected in series;
    an interpolator connected to said delay matrix configured to receive a clock signal and to generate M output signals at equal interval phase differences corresponding to Td/M where Td is the delay time associated with said delay cells, said interpolator supplying said output signals to the delay matrix;
    a phase detector configured to receive an output signal from a first delay cell and a last delay cell of said N delay cells in a first delay chain among said M delay chains, said phase detector detecting a phase difference between said output signal from said first delay cell and said output signal from said second delay cell;

an electric charge pump connected to said phase detector and configured to generate a control voltage in response to said output signals of said phase detector; and a bias control circuit disposed between said electric charge pump and said delay matrix, said bias control circuit receiving said control voltage and generating bias voltages to control the delay cells of said delay matrix.

2. The DLL circuit of claim 1, further comprising a buffer disposed between said delay matrix and said phase detector, said buffer configured to buffer signals supplied by the delay matrix and output buffered signals to said phase detector.

3. The DLL circuit of claim 1 wherein the delay chains are connected through a resistant network.

4. The DLL circuit of claim 1 wherein the delay chains comprise dummy cells, a first of said dummy cells disposed at a front end of the first delay cell of said delay matrix, a second of said dummy cells disposed at a rear end of the last delay cell of said delay matrix.

5. The DLL circuit of claim 1, further comprising:

a first replica delay cell connected to said interpolator, said first replica delay cell formed by copying the delay cells in the delay matrix, said first replica delay cell configured to receive a clock signal input;

a second replica delay cell formed by copying the delay cells in the delay matrix, said second replica delay cell connected to said first replica delay cell and receiving, as an input, an output signal of said first replica delay cell;

a third replica delay cell formed by copying the delay cells in the delay matrix, said third replica delay cell receiving, as an input, an inverse of said clock signal; and a fourth replica delay cell formed by copying the delay cells in the delay matrix, said fourth replica delay cell connected to said third replica delay cell and receiving, as an input, an output signal of said third replica delay cell.

6. The DLL circuit of claim 5 wherein a unit cell of the interpolator comprises:

a first current mirror comprising at least two PMOS transistors;

a second current mirror connected to said first current mirror and comprising at least two PMOS transistors;

a first differential input unit connected to the first current mirror and the second current mirror, said first differential input unit configured to receive output signals of the first replica delay cell and the third replica delay cell;

a second differential input unit connected to the first current mirror and the second current mirror, said second differential input unit configured to receive output signals of the second replica delay cell and the fourth replica delay cell;

a third current mirror connected to the first current mirror and the second current mirror, said third current mirror comprising at least two NMOS transistors; and a buffer having an input connected to the contact point of the second current mirror and the third current mirror and configured to supply a buffered output signal.

7. The DLL circuit of claim 1, wherein the delay cells respectively comprise:

a first current-starved inverter receiving first through sixth bias voltages, said inverter inverts an input signal and outputting an inverse signal; and a second current-starved inverter receiving first through sixth bias voltages, said inverter inverts the output signal received from the first current-starved inverter and outputs an inverse output signal.

8. The DLL circuit of claim 1, wherein the first and second current-starved inverters respectively comprise:

a first PMOS switching transistor connected in series to a PMOS input transistor and disposed between a voltage source and a current-starved inverter output;

an NMOS input transistor connected in series to a first NMOS switching transistor and disposed between the current-starved inverter output and a ground voltage source;

a first PMOS capacitor connected in series to a second PMOS switching transistor disposed between the voltage source and the current-starved inverter output;

a second PMOS capacitor connected in series to a third PMOS switching transistor disposed between the voltage source and the current-starved inverter output;

a second NMOS switching transistor connected in series to a first NMOS capacitor disposed between the current-starved inverter output and a ground voltage source; and a third NMOS switching transistor connected in series to a second NMOS capacitor disposed between the current-starved inverter output and the ground voltage source, wherein an input signal is applied to gates of the PMOS input transistor and the NMOS input transistor, a first bias voltage is applied to a gate of the first PMOS switching transistor, a second bias voltage is applied to a gate of the first NMOS switching transistor, a third bias voltage is applied to a gate of the second PMOS switching transistor, fourth bias voltage is applied to a gate of the third PMOS switching transistor, and fifth bias voltage is applied to the second NMOS switching transistor, and a sixth bias voltage is applied to the third NMOS switching transistors.

9. The DLL circuit of claim 7, wherein the bias control circuit comprises:

a first bias circuit, which receives the control voltage and generates first and second bias voltages;

a second bias circuit, which receives the control voltage and generates third and fifth bias voltages; and a third bias circuit, which receives the control voltage and generates fourth and sixth bias voltages.

10. The DLL circuit of claim 9, wherein the first bias circuit comprises:

an amplifier having a diode-formed PMOS transistor connected between an output node and a pull-down transistor, said amplifier receiving said control voltage; and a buffer circuit, which receives an output of the amplifier to generate the first and second bias voltages.

11. The DLL circuit of claim 9, wherein the second bias circuit comprises:

a first full swing inverter, which receives the control voltage and generates the third bias voltage, the third bias voltage swinging from ground voltage level to the level of voltage according to an increase in the control voltage; and a second full swing inverter connected to the first full swing inverter, said second full swing inverter generating the fifth bias voltage, said fifth bias voltage swinging from the voltage level associated with the increase in the control voltage to the ground voltage level.

12. The DLL circuit of claim 9, wherein the third bias circuit comprises:

a first full swing inverter, which receives the control voltage, configured to generate the fourth bias voltage, the fourth bias voltage having its full swing from ground voltage level to the voltage level associated with an increase in the control voltage; and a second full swing inverter connected to the first full swing inverter and configured to generate the sixth bias voltage, said sixth bias voltage having its full swing from the voltage level associated with an increase in the control voltage to the ground voltage level.

* * * * *